United States Patent
Boytard et al.

(10) Patent No.: US 10,768,343 B2
(45) Date of Patent: Sep. 8, 2020

(54) ILLUMINATION MODULES AND OPTOELECTRONIC SYSTEMS

(71) Applicant: Ams Sensors Singapore Pte. Ltd., Singapore (SG)

(72) Inventors: Mai-Lan Elodie Boytard, Zurich (CH); Philipp Müller, Freiburg (DE); Martin Lukas Balimann, Zurich (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 82 days.

(21) Appl. No.: 16/074,262

(22) PCT Filed: Jan. 31, 2017

(86) PCT No.: PCT/SG2017/050045
§ 371 (c)(1),
(2) Date: Jul. 31, 2018

(87) PCT Pub. No.: WO2017/135894
PCT Pub. Date: Aug. 10, 2017

(65) Prior Publication Data
US 2020/0064521 A1     Feb. 27, 2020

Related U.S. Application Data

(60) Provisional application No. 62/289,466, filed on Feb. 1, 2016.

(51) Int. Cl.
*G02B 3/00* (2006.01)
*H04N 13/254* (2018.01)
(Continued)

(52) U.S. Cl.
CPC ............ *G02B 3/0037* (2013.01); *G01B 11/25* (2013.01); *G02B 27/0961* (2013.01); *H01S 5/423* (2013.01); *H04N 13/254* (2018.05)

(58) Field of Classification Search
CPC ............ G02B 3/0037; G02B 27/0961; H04N 13/254; G01B 11/25; H01S 5/423; G03B 35/00
See application file for complete search history.

(56) References Cited

U.S. PATENT DOCUMENTS

| | | | |
|---|---|---|---|
| 8,009,358 B2* | 8/2011 | Zalevsky | G02B 27/0927 359/618 |
| 2007/0286031 A1* | 12/2007 | Matsumoto | G11B 5/314 369/13.13 |

(Continued)

FOREIGN PATENT DOCUMENTS

WO     2015/059705     4/2015

OTHER PUBLICATIONS

ISA/AU, International Search Report for PCT/SG2017/050045 (dated May 8, 2017).

*Primary Examiner* — Alexander Gee
(74) *Attorney, Agent, or Firm* — Michael Best and Friedrich LLP

(57) ABSTRACT

An illumination module for generating a patterned illumination with minimal ambiguity includes an array of light sources having different respective near-field intensity profiles. The illumination module also includes an optical assembly. The optical assembly and the array of light sources can be operable to substantially replicate the different respective near-field intensity profiles of the light sources in the far-field thereby generating a patterned illumination. The patterned illumination can exhibit reduced ambiguity in some instances.

17 Claims, 2 Drawing Sheets

(51) Int. Cl.
  *G01B 11/25*  (2006.01)
  *G02B 27/09*  (2006.01)
  *H01S 5/42*   (2006.01)
  *H01S 5/00*   (2006.01)

(56) References Cited

U.S. PATENT DOCUMENTS

| | | | |
|---|---|---|---|
| 2012/0293625 A1* | 11/2012 | Schneider | G01B 11/25 348/46 |
| 2014/0160914 A1* | 6/2014 | Shiono | G11B 7/24035 369/110.01 |
| 2014/0218912 A1 | 8/2014 | Guehne et al. | |
| 2015/0041680 A1* | 2/2015 | Kim | G01N 21/648 250/458.1 |
| 2015/0301181 A1 | 10/2015 | Herschbach et al. | |
| 2015/0316368 A1* | 11/2015 | Moench | G01B 11/254 348/46 |
| 2016/0033549 A1* | 2/2016 | Kang | G01Q 60/22 850/32 |

* cited by examiner

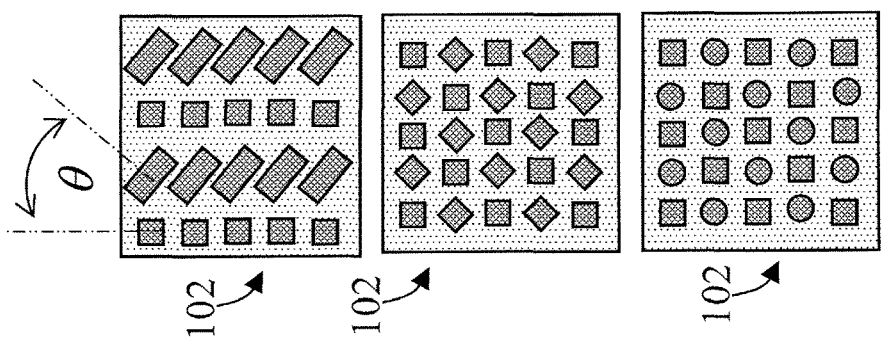
FIG. 1C
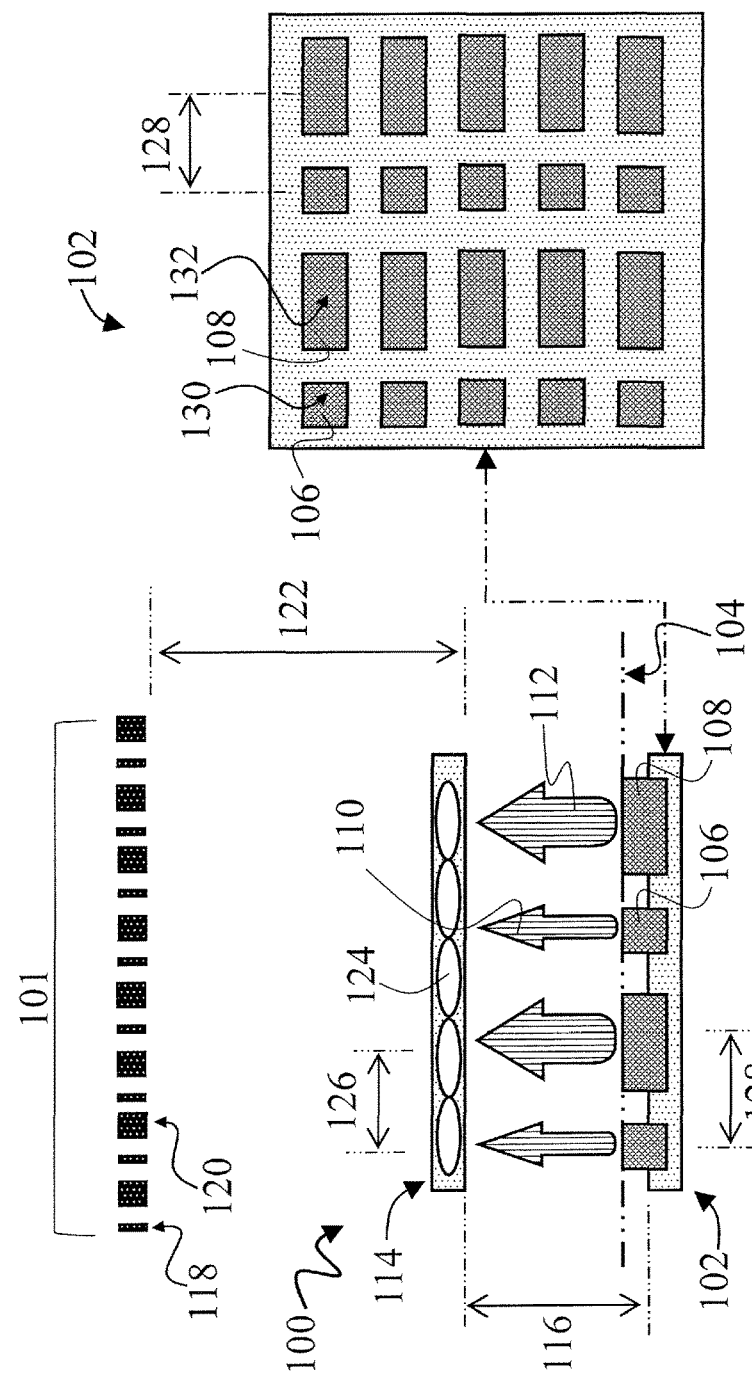
FIG. 1B
FIG. 1A

ILLUMINATION MODULES AND OPTOELECTRONIC SYSTEMS

BACKGROUND

A typical illumination module includes at least a light-emitting component and often an optical assembly together being operable to generate an illumination. Often, the illumination can be a patterned illumination. A patterned illumination can include a regularly repeating unit cell, for example. A patterned illumination can be used, in conjunction with other optoelectronic modules, to generate three-dimensional (3D) data. For example, a patterned illumination can be exploited in an active stereo system for generating 3D data. In other examples, a patterned illumination can be exploited in a structured-light or encoded-light system for generating 3D data.

An encoded-light system can make use of a patterned illumination (e.g., a collection of high-intensity features) with minimal ambiguity. A patterned illumination composed of evenly spaced and uniform features, such as a grid pattern of identical dots, may exhibit significant ambiguity and may significantly complicate efforts to generate 3D data from such a patterned illumination. However, a patterned illumination that exhibits minimal ambiguity (e.g., a sporadic or random, arrangement of high-intensity features, or an arrangement exhibiting at least some irregularity) can be effective, at minimum, in reducing the amount of computational resources required to generate 3D data from a patterned illumination.

A typical illumination module includes an array of light sources and an optical assembly, such as a microlens array. Such a module typically produces a patterned illumination that exhibits significant ambiguity, though the module has many advantages (e.g., the efficiency, or optical power exhibited by such a module may be particularly high). Consequently, a challenge exists to produce modules that include an array of light sources and an optical assembly, but also generates patterned illuminations having minimal ambiguity.

SUMMARY

This disclosure is directed to illumination modules operable to generate patterned illuminations and optoelectronic systems implementing the same. The illumination modules can produce patterned illuminations that exhibit minimal ambiguity. The illumination modules can be used in conjunction with other optoelectronic modules to generate 3D data, such as 3D point clouds and 3D images.

In a first aspect, for example, an illumination module can include an array of light sources. The array of light source can occur within a common emission plane. Each light source can generate light with a near-field intensity profile at the common emission plane. The array of light sources can include at least two light sources with different respective near-field intensity profiles at the common emission plane. The illumination module can further include an optical assembly mounted at a distance from the common emission plane. The optical assembly and the array of light sources can be operable to substantially replicate the different respective near-field intensity profiles of the at least two light sources in a far-field.

In another aspect, for example, an illumination module can include an optical assembly that is a microlens array. The microlens array can include a plurality of microlenses respectively arranged at a microlens pitch.

In another aspect, for example, an illumination module can include an array of light sources that are respectively arranged at a light-source pitch.

In another aspect, for example, an illumination module can include an optical assembly that is a microlens array, and an array of light sources that are respectively arranged at a light-source pitch. The microlens array can include a plurality of microlenses respectively arranged at a microlens pitch that is substantially equal to the light-source pitch.

In another aspect, for example, an illumination module can include at least two light sources having different respective near-field intensity profiles that are operable to generate light having the same wavelength and/or range of wavelengths.

In another aspect, for example, an illumination module can include at least two light sources having different near-field intensity profiles that are operable to generate light having different wavelengths and/or ranges of wavelengths.

In another aspect, for example, an illumination module can include an optical assembly that is a microlens array. The microlens array can include a plurality of microlenses respectively arranged at a microlens pitch. The microlens pitch can be substantially equal to the square root of the product of the integer 2 divided by an integer greater than or equal to 1, the wavelength and/or range of wavelengths, and the distance.

In another aspect, for example, an illumination module can include a distance that is substantially equal to an optical path length established by a common emission plane and a microlens array.

In another aspect, for example, an illumination module can include an array of light sources. The array of light sources can include an array of laser diodes.

In another aspect, for example, an illumination module can include an array of light sources that are an array of laser diodes. The laser diodes can include an array of vertical-cavity surface-emitting lasers.

In another aspect, for example, an illumination module can include an array of light sources that further include an array of auxiliary apertures. The auxiliary apertures can be operable to generate at least two light sources having different respective near-field intensity profiles.

In another aspect, for example, an illumination module can include an optical assembly that is a microlens array. The microlens array can include a plurality of microlenses respectively arranged at a microlens pitch. The microlens pitch can be substantially equal to the square root of the product of the integer 2 divided by an integer greater than or equal to 1, the wavelength and/or range of wavelengths, and the distance. Further, the integer great than or equal to 1 can be any of the following integers: 1, 2, 3, 4, 5, 6, 7, or 8.

In another aspect, for example, an illumination module can be operable to generate a patterned illumination that is an encoded light pattern.

In another aspect, for example, an optoelectronic system operable to generate 3D data can include an illumination module for generating a patterned illumination, and an imager operable to capture light reflected from the patterned illumination;

In another aspect, for example, an optoelectronic system operable to generate 3D data can include an illumination module that further includes an array of light sources having a common emission plane. Each light source can generate light having a near-field intensity profile at the common emission plane. The array of light sources can be respectively arranged at a light-source pitch. The array of light sources can include at least two light sources having different respective near-field intensity profiles at the common emission plane. The illumination module can further include a microlens array mounted at a distance from the common emission plane. The microlens array can include a plurality of microlenses respectively arranged at a microlens pitch. Moreover, the microlens array, the distance, and the array of light sources can be operable to substantially replicate the different respective near-field intensity profiles of the at least two light sources in a far-field.

In another aspect, for example, an optoelectronic system operable to generate 3D data can include an optical assembly that is a microlens array, and an array of light sources that are respectively arranged at a light-source pitch. The microlens array can include a plurality of microlenses respectively arranged at a microlens pitch that is substantially equal to the light-source pitch.

In another aspect, for example, an optoelectronic system operable to generate 3D data can include at least two light sources having different respective near-field intensity profiles that are operable to generate light having the same wavelength and/or range of wavelengths.

In another aspect, for example, an optoelectronic system operable to generate three-dimensional data can include an optical assembly that is a microlens array. The microlens array can include a plurality of microlenses respectively arranged at a microlens pitch. The microlens pitch can be substantially equal to the square root of the product of the integer 2 divided by an integer greater than or equal to 1, the wavelength and/or range of wavelengths, and the distance. Further, the integer great than or equal to 1 can be any of the following integers: 1, 2, 3, 4, 5, 6, 7, or 8.

In another aspect, for example, an optoelectronic system operable to generate 3D data can include an illumination module operable to generate a patterned illumination that includes an encoded light pattern.

In another aspect, for example, an optoelectronic system operable to generate 3D data can include an array of light sources that include an array of laser diodes.

In another aspect, for example, an optoelectronic system operable to generate 3D data can include an array of laser diodes. The laser diodes can include an array of vertical-cavity surface-emitting lasers.

In another aspect, for example, an optoelectronic system operable to generate 3D data can include an array of light sources that further include an array of auxiliary apertures. The auxiliary apertures can be operable to generate at least two light sources having different respective near-field intensity profiles.

In another aspect, for example, an optoelectronic system operable to generate 3D data can include a processor, and a non-transitory computer-readable medium for operating the optoelectronic system. The non-transitory computer-readable medium can include machine-readable instructions stored thereon, that when executed on the processor, perform operations for generating a patterned illumination with an illumination module, capturing light reflected from the patterned illumination with an imager, converting the captured light to signals, and generating 3D data from the signals.

Other aspects, features, and advantages will be apparent from the following detailed description, the accompanying drawings, and the claims

BRIEF DESCRIPTION OF THE DRAWINGS

FIG. 1A depicts an example of an illumination module with an example array of light sources.

FIG. 1B depicts a plan-view of the array of light sources depicted in FIG. 1A.

FIG. 1C depicts several alternative arrays of light sources.

DETAILED DESCRIPTION

Figure 2:
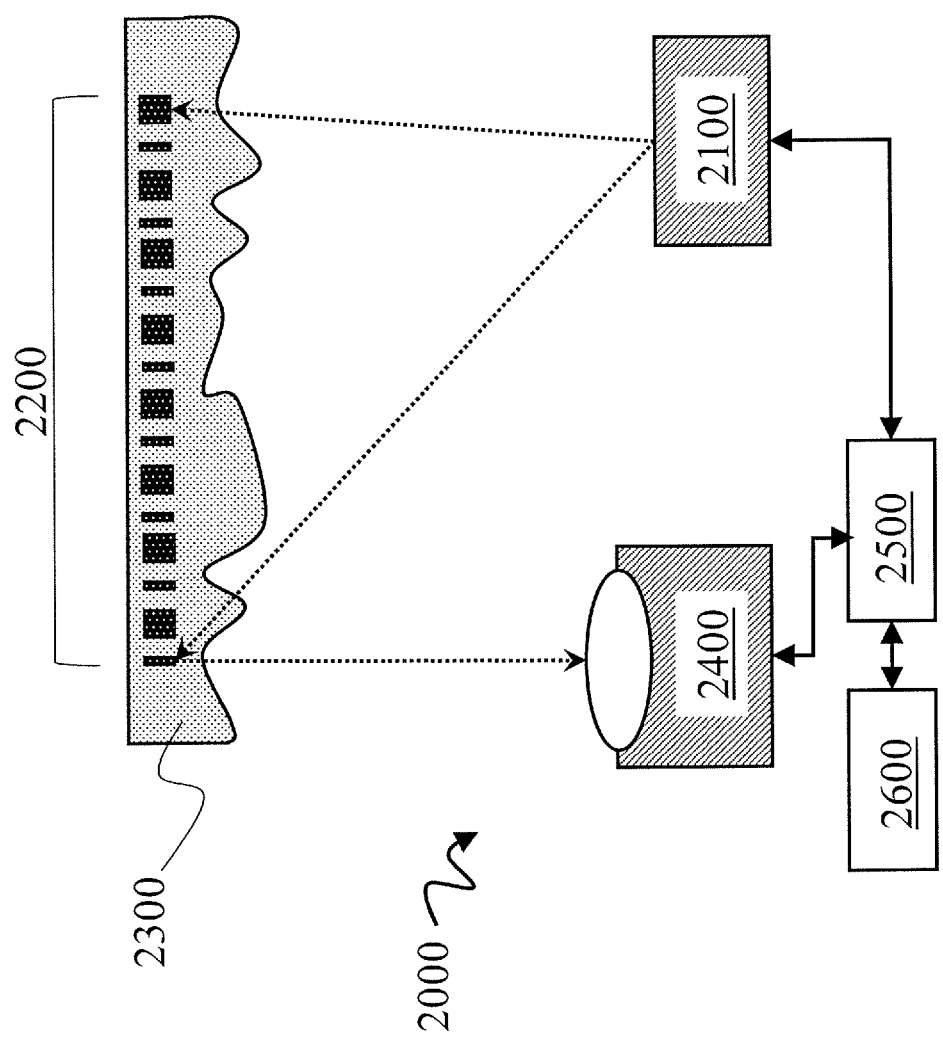
FIG. 2 depicts an example of an optoelectronic system.

FIG. 1A depicts an example illumination module 100. The illumination module 100 is operable to generate a patterned illumination 101 exhibiting minimal ambiguity. The illumination module 100 can include an array of light sources 102. The array of light source 102 can occur within a common emission plane 104. Each light source can generate light with a near-field intensity profile at the common emission plane 104. The array of light sources can include at least two light sources 106, 108 with different respective near-field intensity profiles 110, 112 at the common emission plane 104. In some instances, the at least two light sources having different near-field intensity profiles 106, 108 can be operable to generate light having different wavelengths and/or ranges of wavelengths (e.g., infrared). In some instances, they may be operable to generate light having the same wavelengths and/or ranges of wavelengths (e.g., infrared).

In some instances, the array of light sources 102 can generate collimated light. In some instances, the array of light sources 102 can include an array of laser diodes. The array of laser diodes can include an array of vertical-cavity surface-emitting lasers, for example.

In some instances, the at least two light sources 106, 108 having different respective near-field intensity profiles 110, 112 can be implemented with different respective apertures 130, 132. The apertures 130, 132 can generate the different respective near-field intensity profiles 110, 112 of the corresponding light sources 106, 108. The different apertures 130, 132 can be intrinsic to the laser diodes corresponding to the light sources 106, 108 (i.e., the apertures 130, 132 may be part of the respective diodes that correspond to light sources 106, 108). In some instances, the illumination module can further include an array of auxiliary apertures. That is, the at least two light sources 106, 108 having different respective near-field intensity profiles 110, 112 can be implemented with the different respective auxiliary apertures aligned with the light sources 106, 108. The auxiliary apertures may be composed, at least in part, of metal foils or dielectric materials.

In some instances, the near-field intensity profiles corresponding to the light sources 106, 108 can be established by an aperture or an auxiliary aperture having a two-dimensional geometric shape such as a square, circle, and/or rectangle. In such instances, the at least two light sources having different respective near-field intensity profiles 106, 108 can be generated from apertures having a square and a rectangular shape, respectively. The square aperture can be 9 microns by 9 microns, for example, while the rectangular aperture can be 3 microns by 27 microns, for example. In some implementations, the at least two light sources having different respective near-field intensity profiles 106, 108 can be established by two apertures that have the same shape but with different respective orientations (as discussed further below).

The illumination module can further include an optical assembly 114 mounted at a distance 116 from the common emission plane 104. The distances 116 can be the optical path length between the optical assembly 114 and the array of light sources 102. The optical assembly 114 and the array of light sources 102 can be operable to substantially replicate the different respective near-field intensity profiles 110, 112 of the at least two light sources 106, 108 in a far-field 122 (e.g., one meter, one to 10 meters or even 10 to 100 meters from the illumination module)—the replicated near-field intensity profiles being the patterned illumination 101. In some instances, the optical assembly 114 and the array of light sources 102 can be operable to substantially replicate the different respective near-field intensity profiles 110, 112 of the at least two light sources 106, 108 in the far-field 122 such that the near-field intensity profiles are contracted, dilated, or magnified in the far field 122 (as patterned illumination 101).

In some instances, the optical assembly 114 can be a microlens array. The microlens array can include a plurality of microlenses 124 respectively arranged at a microlens pitch 126. In some instances, the array 102 of the at least two light sources 106, 108 are respectively arranged at a light-source pitch 128.

In some instances, the microlens pitch 126 can be substantially equal to the square root of the product of the integer 2 divided by an integer greater than or equal to 1, the wavelength and/or range of wavelengths, and the distance (when the wavelengths or ranges of wavelengths of light sources 106, 108 are substantially equal). In some instances, the integer greater than or equal to 1 can be any of the following integers: 1, 2, 3, 4, 5, 6, 7, or 8.

Generally, the microlens array, the distance 116, and the array of light sources can be operable to substantially replicate the different respective near-field intensity profiles of the at least two light sources in a far-field.

FIG. 1B depicts a plan-view of the example array of light sources 102 depicted in FIG. 1A. The at least two light sources 106, 108 having different respective near-field intensity profiles 110, 112 are depicted with different apertures 130, 132, respectively. The light sources 106, 108 are depicted at the light-source pitch 128.

FIG. 1C depicts several alternative example arrays of light sources 102 in plan-view. For example, in some instances, the at least two light sources 106, 108 having different respective near-field intensity profiles 110, 112; or the different apertures 130, 132 responsible for the different respective near-field intensity profiles 110, 112 of the at least two light sources 106, 108; can be positioned about an angle θ with respect to each other. In some instances, the at least two light sources 106, 108 having different respective near-field intensity profiles 110, 112; or the different apertures 130, 132 responsible for the different respective near-field intensity profiles 110, 112 of the at least two light sources 106, 108; can be different types of geometric shapes, such as squares and circles. In general, such arrangements (e.g., rotated apertures) of the arrays of light sources 102 can generate a patterned illumination 101 with less ambiguity. In some instances, the angle θ can be 40°, 45°, or 90°.

FIG. 2 depicts an example optoelectronic system 2000 operable to generate 3D data. The optoelectronic system 200 can include an illumination module 2100, such as the illumination module 100 depicted in FIG. 1A-FIG. 1C, and can include example features and components as described in connection with the illumination modules 100.

For example, the illumination module 2100 can include an array of light sources having a common emission plane. Each light source can generate light having a near-field intensity profile at the common emission plane. The array of light sources can be respectively arranged at a light-source pitch. The array of light sources can include at least two light sources having different respective near-field intensity profiles at the common emission plane. Further, the illumination module 2100 can include a microlens array mounted at a distance from the common emission plane. The microlens array can include a plurality of microlenses respectively arranged at a microlens pitch. In some instances, the microlens pitch can be substantially equal to the light-source pitch.

The microlens array, the distance, and the array of light sources can be operable to substantially replicate the different respective near-field intensity profiles of the at least two light sources in a far-field, thereby generating a patterned illumination 2200 as depicted in FIG. 2.

In some instances, the patterned illumination 2200 can be an encoded-light pattern. The patterned illumination can be incident on a target 2300. The target can have 3D features, such as a 3D object or a 3D scene. Light reflected form the patterned illumination can be collected by the imager 2400. Further, the imager 2400 can be operable to capture light reflected from the patterned illumination 2200.

The optoelectronic system 200 can further include a processor 2500 communicatively coupled to the illumination module 2100 and the imager 2400, and can also include a non-transitory computer-readable medium 2600 for operating the optoelectronic system 2000. The non-transitory computer-readable medium 2600 includes instructions stored thereon, that when executed on the processor, perform steps for generating the patterned illumination 2200 with the illumination module 2100, capturing light reflected from the patterned illumination with the imager 2400, converting the captured light to signals, and generating 3D data from the signals.

The optoelectronic system 2000 may be implemented as a structured-light imaging system, a stereo-imaging system, or any other 3D imaging system. Still other optoelectronic systems are within the scope of this disclosure, for example, proximity systems having an imager with only a few pixels.

Various modifications can be made within the spirit of the disclosure. Also, features that may be described above in connection with different implementations can be combined in the same implementation in some cases. Accordingly, other implementations are within the scope of the claims.

What is claimed is:

1. An illumination module for generating a patterned illumination, the illumination module comprising:
   an array of light sources having a common emission plane, each light source generating light having a near-field intensity profile at the common emission plane;
   the array of light sources comprising at least two light sources having different respective near-field intensity profiles at the common emission plane, and the at least two light sources having different respective near-field intensity profiles being operable to generate light having the same wavelength and/or range of wavelengths; and
   an optical assembly mounted at a distance from the common emission plane, the optical assembly and the array of light sources being operable to substantially replicate the different respective near-field intensity profiles of the at least two light sources in a far-field, the optical assembly being a microlens array, the microlens array including a plurality of microlenses respectively arranged at a microlens pitch,
   wherein the microlens pitch is substantially equal to the square root of the product of the integer two divided by an integer greater than or equal to one, the wavelength and/or range of wavelengths, and the distance.

2. The illumination module of claim 1, the array of light sources respectively arranged at a light-source pitch.

3. The illumination module of claim 2, wherein the microlens pitch is substantially equal to the light-source pitch.

4. The illumination module of claim 1, wherein the distance is substantially equal to an optical path length established by the common emission plane and the microlens array.

5. The illumination module of claim 1, wherein the array of light sources comprises an array of laser diodes.

6. The illumination module of claim 5, the array of laser diodes comprising an array of vertical-cavity surface-emitting lasers.

7. The illumination module of claim 5, in which the array of light sources further comprises an array of auxiliary apertures, the auxiliary apertures being operable to generate the at least two light sources having different respective near-field intensity profiles.

8. The illumination module of claim 1, wherein the integer greater than or equal to one is any of the following integers: 1, 2, 3, 4, 5, 6, 7, or 8.

9. The illumination module of claim 1, in which the patterned illumination comprises an encoded light pattern.

10. An optoelectronic system operable to generate three-dimensional data, the optoelectronic system comprising:
   an illumination module for generating a patterned illumination; and
   an imager configured to operably capture and/or collect light reflected from the patterned illumination generated by the illumination module;
   wherein the illumination module includes
      an array of light sources having a common emission plane, each light source generating light having a near-field intensity profile at the common emission plane, the array of light sources respectively arranged at a light-source pitch, the array of light sources including at least two light sources having different respective near-field intensity profiles at the common emission plane, the at least two light sources having different respective near-field intensity profiles being operable to generate light having the same wavelength and/or range of wavelengths, and
      a microlens array mounted at a distance from the common emission plane, the microlens array including a plurality of microlenses respectively arranged at a microlens pitch, the microlens array, the distance, and the array of light sources being operable to substantially replicate the different respective near-field intensity profiles of the at least two light sources in a far-field,
   wherein the microlens pitch is substantially equal to the square root of the product of the integer two divided by an integer greater than or equal to one, the wavelength and/or range of wavelengths, and the distance.

11. The optoelectronic system of claim 10, wherein the microlens pitch is substantially equal to the light-source pitch.

12. The optoelectronic system of claim 10, wherein the integer greater than or equal to one is any of the following integers: 1, 2, 3, 4, 5, 6, 7, or 8.

13. The optoelectronic system of claim 10, wherein the patterned illumination comprises an encoded light pattern.

14. The optoelectronic system of claim 10, wherein the array of light sources comprises an array of laser diodes.

15. The optoelectronic system of claim 14, the array of laser diodes comprising an array of vertical-cavity surface-emitting lasers.

16. The optoelectronic system of claim 10, wherein the array of light sources further comprises an array of auxiliary apertures, the auxiliary apertures being operable to generate the at least two light sources having different respective near-field intensity profiles.

17. The optoelectronic system of claim 10, further including
   a processor, and
   a non-transitory computer-readable medium for operating the optoelectronic system, wherein the non-transitory computer-readable medium includes instructions stored thereon, that when executed on the processor, perform steps for generating a patterned illumination with the illumination module, capturing light reflected from the patterned illumination with the imager, converting the captured light to signals, and generating three-dimensional data from the signals.

* * * * *